United States Patent [19]

Moon

[11] 4,363,135
[45] Dec. 7, 1982

[54] FOUR BAND VHF VARACTOR TUNER

[75] Inventor: Fred H. Moon, Mt. Prospect, Ill.

[73] Assignee: Zenith Radio Corporation, Glenview, Ill.

[21] Appl. No.: 200,806

[22] Filed: Oct. 27, 1980

[51] Int. Cl.³ .......................... H04N 5/44; H04B 1/16
[52] U.S. Cl. .................................... 455/180; 455/188; 455/176
[58] Field of Search ............... 455/180, 187, 188, 189, 455/191, 176, 178, 168, 314; 334/14, 15, 18, 42; 358/191.1

[56] References Cited

U.S. PATENT DOCUMENTS

| | | | |
|---|---|---|---|
| 3,526,859 | 9/1970 | Putzer | 455/191 |
| 3,559,075 | 6/1971 | Okazaki | 455/180 |
| 3,611,154 | 10/1971 | Kupfer | 455/180 |
| 3,646,450 | 2/1972 | Ma | 455/180 |
| 3,942,122 | 3/1976 | Nakanishi | 455/180 |
| 3,980,957 | 9/1976 | Putzer | 455/180 |
| 4,002,986 | 1/1977 | Ma | 455/180 |
| 4,247,953 | 1/1981 | Shinagawa | 455/180 |
| 4,271,529 | 6/1981 | Strammello, Jr. | 455/180 |
| 4,326,295 | 4/1982 | Matsumoto et al. | 455/180 |

Primary Examiner—Tommy P. Chin
Attorney, Agent, or Firm—Jack Kail

[57] ABSTRACT

A varactor controlled television receiver tuning system is operable for tuning all VHF and CATV television channels in four frequency bands including the low VHF band extending between 54-88 MHz, the mid/-high VHF band extending between 120-216 MHz, the CATV superband extending between 216-300 MHz and a CATV hyperband extending between 300-400 MHz. The tuning system comprises a plurality of identically configured resonant circuits each responsive to a pair of band switching signals for assuming a total inductance for tuning each of the four different frequency bands, each of the resonant circuits being alignable by adjusting a different variable reactance element in each frequency band.

7 Claims, 3 Drawing Figures

FOUR BAND VHF VARACTOR TUNER

BACKGROUND OF THE INVENTION

The present invention relates generally to voltage-controlled tuning systems for television receivers and, more particularly, to a tuner circuit for tuning all VHF and CATV channels including those having carrier frequencies in the low VHF band, the mid/high VHF band, the CATV superband and the so-called CATV hyperband.

The present U.S. television signal spectrum for VHF and CATV channels can be divided into three bands; a low VHF band extending between 54–88 MHz and including VHF channels 2-6, a mid/high VHF band extending between 120–216 MHz and including CATV channels A-I and VHF channels 7-13 and a CATV superband extending between 216–300 MHz and including CATV channels J-W. There has recently been much interest in extending the CATV frequency spectrum beyond the present superband to a so-called hyperband which includes 18 CATV channels in the band of carrier frequencies between 300–400 MHz. There is presently no known television receiver tuning system on the market capable of covering this extended CATV spectrum other than those systems utilizing an additional tuner (i.e. a CATV converter) which converts all CATV signals to a signal corresponding to one of the low VHF channels.

Co-pending application Ser. No. 132,348 filed Mar. 20, 1980, now U.S. Pat. No. 4,271,529 and assigned to the assignee of the present invention, which application is incorporated herein by reference, discloses a VHF/CATV tuning system in which a single tuning circuit is used to tune all VHF and CATV channels in the low VHF band, the mid/high VHF band and the CATV superband. The tuning circuit includes a plurality of tunable resonant circuits each comprising a voltage-controlled variable capacitance diode, commonly referred to as a varactor diode, and an arrangement of three inductors connected thereto. A pair of band switching diodes are also connected in the circuit, the switching diodes being operative in response to suitable bandswitching signals for connecting three different combinations of the inductors across the varactor diode to achieve a different resonant condition for tuning each of the three different bands. Since three different reactance elements, i.e. the three inductors, are included in the resonant circuit, the resonant circuit may be suitably aligned for tuning each of the three different bands by suitably adjusting the inductance of an appropriate one of the inductors. The foregoing resonant circuit does not, however, enable proper tuning of an additional fourth band of channels such as the CATV hyperband initially because there is no teaching with regard to establishing the necessary fourth resonant condition and, secondly, because there is no facility for aligning the circuit for properly tuning the additional band.

It is, accordingly, an object of the present invention to provide a novel multi-band television receiver tuning system capable of tuning all VHF and CATV channels including those having carrier frequencies in the so-called hyperband extending between 300–400 MHz.

Another object of the invention is to provide a single, easily aligned, all channel, voltage-controlled tuning system for operation over all VHF bands as well as all CATV bands including the hyperband.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, in which:

DESCRIPTION OF THE PREFERRED EMBODIMENT

In accordance with the transmission broadcast standards existing in the United States, the first five VHF television channels (channels 2-6) are transmitted within a low VHF band which extends from 54 to 88 MHz, while the remaining sevel channels (channels 7-13) are transmitted within the high VHF portion (174–216 MHz) of a second band of frequencies which extends from 120 to 216 MHz. The remaining portion of this second band, i.e. the frequency range of 120–174 MHz, is commonly referred to as the mid-band frequency range and is used, together with a band of frequencies known as the superband which extends from 216 to 300 MHz, to transmit additional CATV signals. In addition, much interest has recently been expressed in extending the CATV frequency spectrum beyond the superband range to a so-called hyperband which extends from 300 to 400 MHz.

Figure 1:
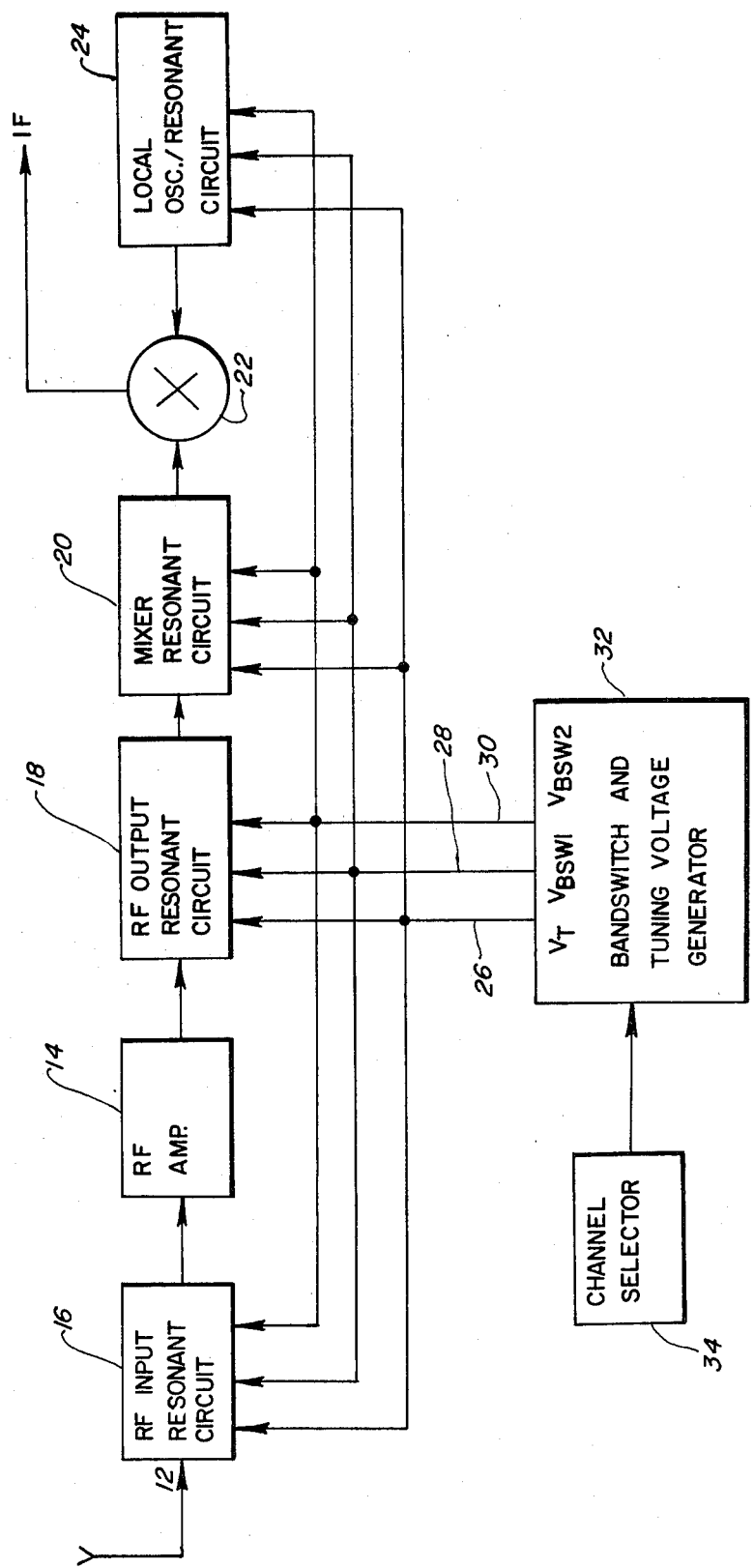
FIG. 1 is a block diagram of a television receiver tuning system incorporating the present invention.

Referring to FIG. 1, there is shown in block diagram form, a typical tuning system for selectively tuning a television receiver to any channel within the foregoing VHF and CATV frequency bands including the hyperband. The tuning system is of the super heterodyne type and includes an antenna input 12 which couples the received RF television signal to an RF amplifier 14 through a first input resonant circuit 16. The amplified output of RF amplifier 14 is coupled through an additional pair of resonant circuits 18 and 20, together forming a double-tuned interstage coupling network, to one input of a mixer 22. The other input to mixer 22 is derived from a local oscillator 24 which includes a fourth resonant circuit determining its operating frequency. When properly tuned to receive a given channel, each of the resonant circuits 16, 18 and 20 is tuned to resonate at the channel's center frequency; namely, at the frequency midway between the video and audio RF carriers of that channel. The resonant circuit associated with local oscillator 24 is adjusted to resonate at a frequency appropriately higher than the center frequency by a fixed amount as determined by the intermediate frequency (IF) of the system. In accordance with the super heterodyne technique, the two RF carriers are converted to IF carriers in mixer 22 by beating or heterodyning the RF carriers with the local oscillator signal.

Conditioning of the tuning system to select or process a particular desired television channel therefore typically requires the adjustment or tuning of four different tunable resonant circuits. As will be explained in further detail hereinafter, each of the resonant circuits is tuned for processing the selected television channel in response to a DC tuning voltage $V_t$ and to band switching signals $V_{bsw1}$ and $V_{bsw2}$ developed on output conductors 26, 28 and 30 respectively of a band switch and tuning voltage generator 32 whose operation is, in turn, controlled by a channel selector 34. The tuning voltage $V_t$ developed on conductor 26 may be produced in any of a variety of well known ways. A relatively simple scheme involves the use of a potentiometer as disclosed in U.S. Pat. No. 3,646,450. Also, the band switching signals $V_{bsw1}$ and $V_{bsw2}$ developed on conductors 28 and 30 may be supplied using any of a number of well known techniques. Since the present invention is capable of operating satisfactorily with any of the conventional methods for generating tuning voltage $V_t$ and bandswitching signals $V_{bsw1}$ and $V_{bsw2}$ and does not directly concern the generation of such signals, a detailed description of bandswitch and tuning voltage generator 32 will not be provided here.

Figure 2:
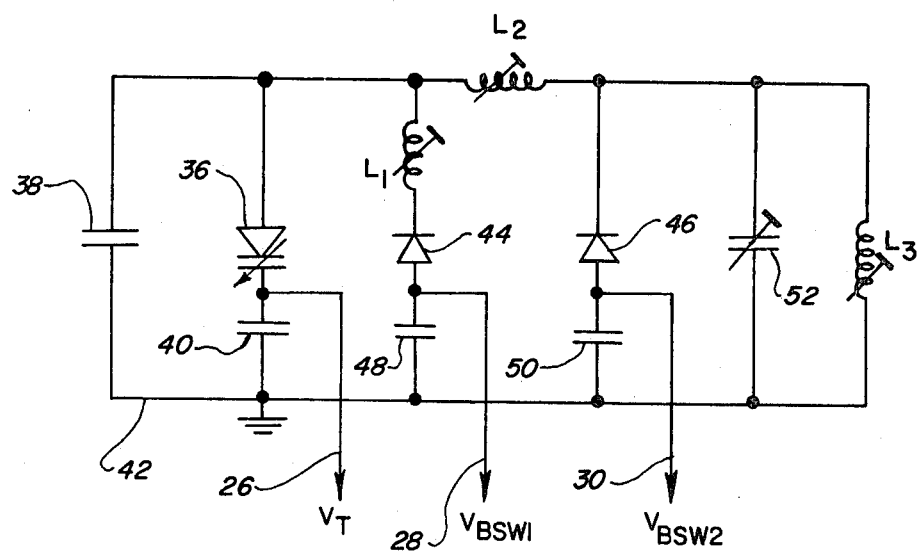
FIG. 2 is a detailed schematic diagram illustrating the construction of the various resonant circuits shown generally in FIG. 1.

FIG. 2 schematically illustrates the construction of the four tunable resonant circuits generally illustrated in FIG. 1, each of the resonant circuits preferably being of identical construction with the electrical parameters of the elements of the resonant circuit associated with local oscillator 24 differing from the electrical parameters of the corresponding elements of resonant circuits 16, 18 and 20. The tunable resonant circuit illustrated in FIG. 2 comprises a voltage-controlled variable reactance device, in the form of a varactor or variable capacitance diode 36 connected in shunt relationship with an offset capacitor 38 through a DC blocking capacitor 40. The DC tuning voltage $V_t$ is coupled from conductor 26 to the junction formed between varactor diode 36 and capacitor 40 for controlling the capacitance of varactor diode 36 for tuning a selected channel within a particular frequency band. DC blocking capacitor 40 isolates the ground line 42 from DC while providing a low impedance path for high frequency signals.

The anode of varactor diode 36 is connected through a first inductance coil $L_1$ to the cathode of a first band switching diode 44 and through a second inductance coil $L_2$ to the cathode of a second band switching diode 46. The anode of band switching diode 44 is connected to conductor 28 for receiving band switching signal $V_{bsw1}$ and also through a second DC blocking capacitor 48 to ground line 42 while the anode of band switching diode 46 is connected to conductor 30 for receiving band switching signal $V_{bsw2}$ and also through a third and final DC blocking capacitor 50 to ground line 42. The common junction between inductance coil $L_2$ and band switching diode 46 is connected to one end of a third inductance coil $L_3$ whose other end is connected to ground line 42, a variable trimmer capacitor 52 being connected in shunt relationship with inductance coil $L_3$.

The resonant frequency of the tunable resonant circuit of FIG. 2 is determined primarily by the combined capacitance of capacitor 38, trimmer capacitor 52 and varactor diode 36 together with, depending upon the states of band switching diodes 44 and 46, selected combinations of the inductances of one or more of the inductance coils $L_1$, $L_2$ and $L_3$. In particular, in order to tune a channel in the low VHF band, the band switching signals developed on conductors 28 and 30 are both logical 0 so that both band switching diodes 44 and 46 are non-conductive. In this case, the total inductance of the resonant circuit is equal to the sum of the inductances of inductance coils $L_2$ and $L_3$. With this total inductance, the resonant circuit is tuned for processing the selected channel in the low VHF band by adjusting the capacitance of varactor diode 36 in response to the tuning voltage $V_t$ developed on conductor 26. The mid/high VHF band is tuned in response to the band switching signals $V_{bsw1}$ and $V_{bsw2}$ assuming values of logical 1 and logical 0 respectively whereby band switching diode 44 is rendered conductive and band switching diode 46 non-conductive. Now, the total inductance of the resonant circuit consists of the inductance of inductance coil $L_1$ in parallel with the inductance of the series combination of inductance coils $L_2$ and $L_3$. As before, the selected channel within the frequency band is tuned by appropriately setting the tuning voltage $V_t$ for adjusting the capacitance of varactor diode 36.

Figure 3:
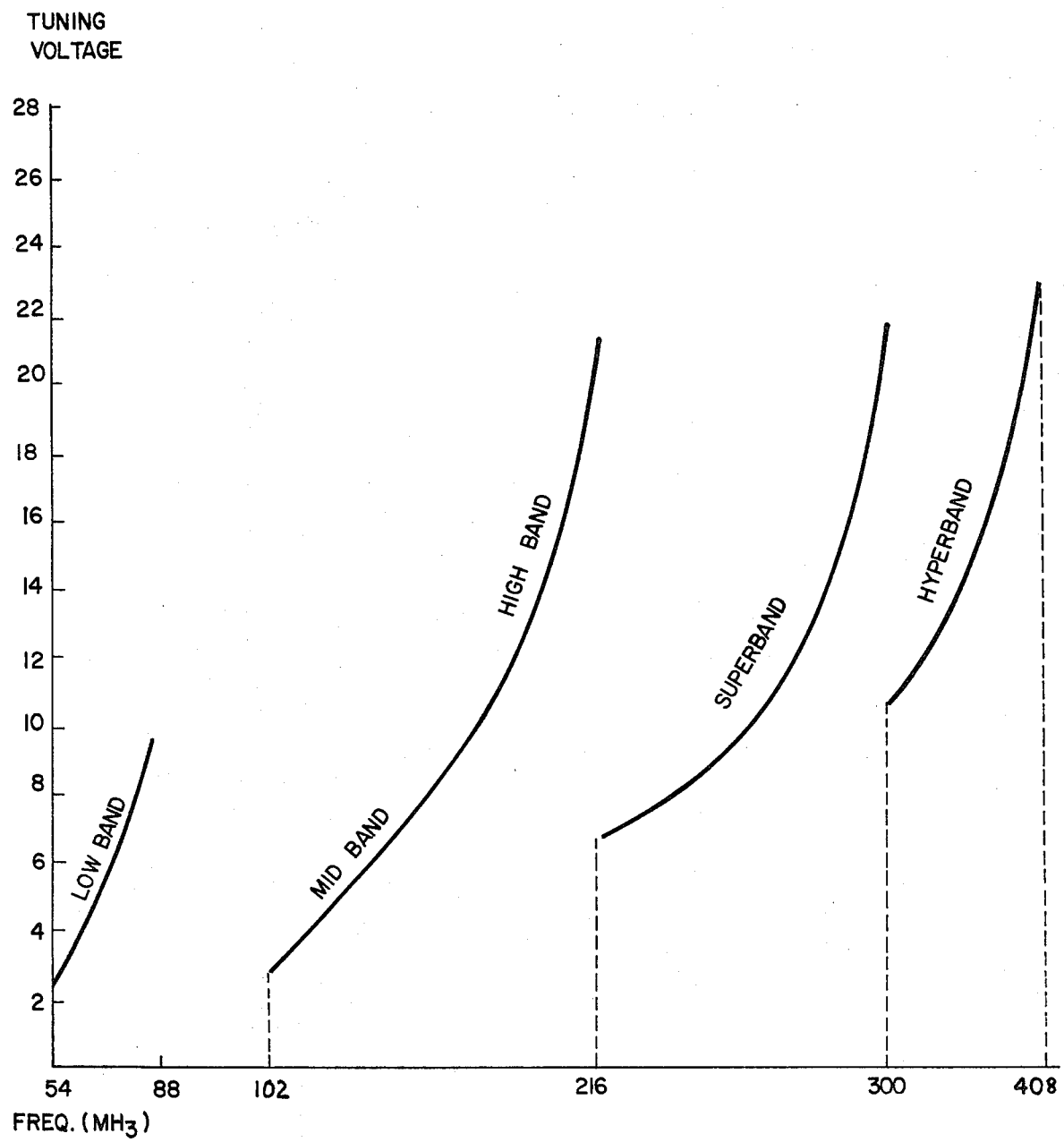
FIG. 3 graphically illustrates the relationships between tuning voltage, television channels and frequency bands in the VHF and CATV frequency spectrum.

The television channels within the superband range of frequencies are tuned in response to the band switching signals $V_{bsw1}$ and $V_{bsw2}$ assuming values of logical 0 and logical 1 respectively. As a result, band switching diode 44 is rendered non-conductive while band switching diode 46 is rendered conductive, short circuiting inductance coil $L_3$. The total inductance of the resonant circuit is therefore equivalent to the inductance of inductance coil $L_2$. Finally, the television channels within the hyperband range of frequencies are tuned by causing both band switching signals $V_{bsw1}$ and $V_{bsw2}$ to assume a logical 1 value rendering both band switching diodes 44 and 46 conductive. Inductance coil $L_3$ is again short circuited so that the total inductance of the resonant circuit consists of the parallel combination of the inductances of inductance coils $L_1$ and $L_2$. As in the previous cases, the tuning voltage $V_t$ is appropriately adjusted to tune the selected channel within this band of frequencies. It will thus be noted that the band switching signals $V_{bsw1}$ and $V_{bsw2}$ developed on conductors 28 and 30 condition the resonant circuit for exhibiting four different values of total inductance for tuning the four different frequency bands. Within each band, the selected channel is determined by the tuning voltage $V_t$ developed on conductor 26 which adjusts the capacitance of varactor diode 36 for the selected channel. For convenience, the foregoing is set forth in tabular form below. Also, the relationship between the tuning voltage $V_t$ and the four different frequency bands is set forth graphically in FIG. 3.

|  | Low Band | Mid/High Band | Superband | Hyperband |
|---|---|---|---|---|
| Df (MHz) | 54–88 | 120–216 | 216–300 | 300–400 |
| Diode 44 | Off | On | Off | On |
| Diode 46 | Off | Off | On | On |
| $L_T$ | $L_2 + L_3$ | $L_1//(L_2 + L_3)$ | $L_2$ | $L_1//L_2$ |

In order for the tunable resonant circuit of FIG. 2 to provide proper performance it must be aligned or adjusted for each of the four different frequency bands. This alignment procedure is facilitated by the fact that the resonant circuit includes four separate circuit elements, the reactances of three of the elements being independently adjustable with the reactance of the fourth being semi-independently adjustable. These four reactances are represented by the capacitance of trimmer capacitor 52 and the inductances of inductance coils $L_1$, $L_2$ and $L_3$ each of which preferably comprises an air wound coil having an adjustable core element disposed therein.

The alignment procedure for the resonant circuit is carried out as follows. Initially, the band switching signals $V_{bsw1}$ and $V_{bsw2}$ developed on conductors 28 and 30 are set for tuning the resonant circuit to the superband range of frequencies where band switching diode 44 is non-conductive and band switching diode 46 is conductive such that the total effective inductance of the circuit consists of the inductance of inductance coil $L_2$. The tuning voltage $V_t$ developed on conductor 26 is then adjusted for setting the capacitance of varactor diode 36 to a selected channel within the superband range of frequencies in accordance with the graphical representation of FIG. 3. Thereafter, the inductance of inductance coil $L_2$ is manually adjusted for optimum tuning of the selected channel, it being assumed that this adjustment of inductance coil $L_2$ will also properly align the resonant circuit for tuning the remaining channels within the band. Next, the resonant circuit is conditioned for tuning the hyperband range of frequencies. In this case, the band switching signals $V_{bsw1}$ and $V_{bsw2}$ are set for causing both band switching diodes 44 and 46 to conduct whereby the total inductance of the resonant circuit consists of the parallel combination of the inductances of inductance coils $L_1$ and $L_2$. The tuning voltage $V_t$ is then adjusted for setting the capacitance of varactor diode 36 to a selected channel within the hyperband range of frequencies in accordance with the hyperband tuning curve of FIG. 3. Next, the inductance of inductance coil $L_1$ is manually adjusted so that the parallel combination of inductance coils $L_1$ and $L_2$ yield an inductance value for optimum tuning of the selected channel, it again being assumed that this adjustment will also properly align the resonant circuit for tuning the remaining channels within the hyperband frequency range.

The next step is to align the resonant circuit for the mid/high VHF band. The resonant circuit is therefore conditioned for tuning this band, i.e. band switching diode 44 is rendered conductive and band switching diode 46 is rendered non-conductive, and the tuning voltage $V_t$ is adjusted for setting the capacitance of varactor diode 36 to a selected channel within the band in accordance with the mid/high VHF band tuning curve of FIG. 3. In this case, however, instead of adjusting the inductance of one of the inductance coils $L_1$, $L_2$ or $L_3$, the capacitance of trimmer capacitor 52 is adjusted for adjusting the resonant frequency of the circuit for optimumly tuning the selected channel within the band. In this regard, component values are selected such that the inductance of inductance coil $L_2$ is much smaller than the inductance of inductance coil $L_3$, e.g. on the order of about ten times smaller, so that the capacitance of trimmer capacitor 52 is connected essentially across varactor diode 36 to facilitate adjustment of the resonant frequency of the circuit. It is again assumed that this latter adjustment will also properly align the resonant circuit for tuning the remaining channels within the mid/high VHF band. The final frequency band, i.e. the low VHF band, is now aligned. The resonant circuit is conditioned for tuning this band by causing both band switching diodes 44 and 46 to be non-conductive whereby the total effective inductance of the resonant circuit consists of the series inductance of inductance coils $L_2$ and $L_3$. The tuning voltage $V_t$ is again adjusted for setting the capacitance of varactor diode 36 to a selected channel within the low VHF band and the inductance of inductance coil $L_3$ is manually adjusted for optimum tuning of the selected channel within the band. The latter two alignment steps, i.e. the alignment of the mid/high VHF band and the alignment of the low VHF band, may be repeated if necessary to properly align the two bands. As a result of the foregoing, the resonant circuit has been independently aligned for each of the four different bands and is therefore set for tuning all of the channels within the bands.

The invention provides, therefore, a novel VHF/CATV television receiver tuner with extended coverage of CATV television channels to the hyperband range of frequencies extending from 300 to 400 MHz. The television receiver tuner includes a plurality of tunable resonant circuits which are inexpensively manufactured and easily aligned.

While particular embodiments of the particular invention have been shown and described, it will be obvious to those skilled in the art that changes and modifications may be made without departing from the true invention in its broader aspects, and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined from the following claims when viewed in their proper perspective against the prior art.

What is claimed is:

1. In a television receiver of the type including a three-band varactor tuned resonant circuit comprising a varactor diode; first, second and third inductance means; and first and second switching means selectively operable for connecting three different combinations of said inductance means across said varactor diode for tuning three different television signal bands, the improvement comprising:

means for selectively operating said first and second switching means for connecting four different combinations of said inductance means across said varactor diode to allow the tuning of four different VHF/CATV television signal bands; and tuning means connected in circuit with said inductance means and having a variable reactance adjustable for facilitating the alignment of said resonant circuit for tuning one of said four bands.

2. The improvement according to claim 1 wherein said tuning means comprises a trimmer capacitor having a manually adjustable capacitance.

3. The improvement according to claim 2 wherein one of said four different television signal bands comprises a hyperband for transmitting CATV signals over a frequency range extending from about 300 MHz to about 400 MHz.

4. The impovement according to claim 3 wherein said first, second and third inductance means are each manually adjustable for exhibiting different levels of inductance and, in combination with said trimmer capacitor, allow said resonant circuit to be aligned when tuned to each respective one of said four different television signal bands.

5. A resonant circuit for facilitating tuning a television receiver to a selected channel within one of four frequency bands comprising a low VHF band extending from 54 to 88 MHz, a mid/high VHF band extending from 120–216 MHz, a CATV superband extending from 216–300 MHz and a CATV hyperband extending from about 300 to about 400 MHz, said resonant circuit comprising:

first, second and third variable inductance means;

band switching means selectively operable for interconnecting said first, second and third inductance means in four different arrangements each characterized by a different value of total inductance and each adapted for tuning one of said four frequency bands;

varactor diode means connected in circuit with said first, second and third inductance means and operable for, in association with said band switched first, second and third inductance means, tuning a selected channel in each of said four frequency bands; and manually adjustable variable reactance means connected in circuit with said inductance means, one of said first, second and third inductance means and said variable reactance means being manually adjustable for aligning said resonant circuit when operated for tuning each respective one of said four frequency bands.

6. The resonant circuit according to claim 5 wherein said manually adjustable variable reactance means comprises a trimmer capacitor.

7. The resonant circuit according to claim 6 wherein said bandswitching means comprises means selectively operable for interconnecting said inductance means in four different arrangements characterized by respective total inductance values of $(L_2+L_3)$ for tuning said low VHF band, the parallel combination of $L_1$ and $(L_2+L_3)$ for tuning said mid/high VHF band, $L_2$ for tuning said superband and the parallel combination of $L_1$ and $L_2$ for tuning said hyperband, where $L_1$, $L_2$ and $L_3$ represent the inductances of said first, second and third inductance means respectively, whereby said second inductance means is adjustable for aligning said resonant circuit when tuned to said superband, said first inductance means is adjustable for aligning said resonant circuit when tuned to said hyperband, said trimmer capacitor is adjustable for aligning said resonant circuit when tuned to said mid/high VHF band and said third inductance means is adjustable for aligning said resonant circuit when tuned to said low VHF band.

* * * * *